United States Patent
Park et al.

(10) Patent No.: US 10,727,173 B2
(45) Date of Patent: Jul. 28, 2020

(54) POWER MODULE AND POWER CONVERSION SYSTEM INCLUDING SAME

(71) Applicants: HYUNDAI MOTOR COMPANY, Seoul (KR); KIA MOTORS CORPORATION, Seoul (KR)

(72) Inventors: Jun Hee Park, Hwaseong-si (KR); Hyeon Uk Kim, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 160 days.

(21) Appl. No.: 15/834,541

(22) Filed: Dec. 7, 2017

(65) Prior Publication Data

US 2019/0051586 A1 Feb. 14, 2019

(30) Foreign Application Priority Data

Aug. 8, 2017 (KR) ........................ 10-2017-0100413

(51) Int. Cl.
| | |
|---|---|
| *H01L 23/495* | (2006.01) |
| *H01L 23/00* | (2006.01) |
| *H01L 23/492* | (2006.01) |
| *H01L 23/051* | (2006.01) |
| *H01L 21/50* | (2006.01) |

(Continued)

(52) U.S. Cl.
CPC ........ *H01L 23/49575* (2013.01); *H01L 21/50* (2013.01); *H01L 23/051* (2013.01); *H01L 23/473* (2013.01); *H01L 23/492* (2013.01); *H01L 23/4951* (2013.01); *H01L 23/49513* (2013.01); *H01L 23/49527* (2013.01); *H01L 23/49537* (2013.01); *H01L 23/49548* (2013.01); *H01L 23/49558* (2013.01); *H01L 23/49568* (2013.01); *H01L 23/49586* (2013.01); *H01L 24/33* (2013.01); *H01L 23/10* (2013.01); *H01L 24/29* (2013.01); *H01L 24/32* (2013.01); *H01L 2224/291* (2013.01); *H01L 2224/32225* (2013.01); *H01L 2224/32257* (2013.01);

(Continued)

(58) Field of Classification Search
None
See application file for complete search history.

(56) References Cited

U.S. PATENT DOCUMENTS

| | | | | |
|---|---|---|---|---|
| 5,382,928 A | * | 1/1995 | Davis | ........... H03H 1/0007 333/182 |
| 6,442,033 B1 | * | 8/2002 | Liu | ........... H01L 21/563 174/538 |

(Continued)

FOREIGN PATENT DOCUMENTS

KR 10-2015-0119302 A 10/2015

*Primary Examiner* — Telly D Green
(74) *Attorney, Agent, or Firm* — Morgan, Lewis & Bockius LLP

(57) ABSTRACT

A power module includes an upper substrate comprising a plurality of circuit pattern areas made of a metal and a dielectric area disposed between each of the plurality of circuit pattern areas; a lower substrate including a plurality of circuit pattern areas made of a metal and a dielectric area disposed between each of the plurality of circuit pattern areas; and a semiconductor element having an upper terminal and a lower terminal, the upper terminal and the lower terminal being bonded to a lower surface of the upper substrate and an upper surface of the lower substrate, respectively.

10 Claims, 2 Drawing Sheets

(51) Int. Cl.
   *H01L 23/473* (2006.01)
   *H01L 23/10* (2006.01)
(52) U.S. Cl.
   CPC .............. *H01L 2224/32258* (2013.01); *H01L 2224/33181* (2013.01); *H01L 2924/15153* (2013.01)

(56) References Cited

U.S. PATENT DOCUMENTS

| | | | | |
|---|---|---|---|---|
| 9,041,183 B2* | 5/2015 | Liang | .................... | H01L 25/072 257/691 |
| 9,922,911 B1* | 3/2018 | Park | .................. | H01L 23/49562 |
| 2002/0070439 A1* | 6/2002 | Hiramatsu | .............. | H01L 23/24 257/687 |
| 2004/0169266 A1* | 9/2004 | Maxwell | ............. | H01L 23/5385 257/684 |
| 2006/0151874 A1* | 7/2006 | Milich | ................... | H01L 25/072 257/713 |
| 2006/0182973 A1* | 8/2006 | Lee | ........................ | C08G 59/38 428/413 |
| 2007/0097597 A1* | 5/2007 | Ko | ....................... | H01G 4/1209 361/311 |
| 2008/0230889 A1* | 9/2008 | Standing | ............... | H01L 23/492 257/693 |
| 2009/0111214 A1* | 4/2009 | Christensen | ........ | H01L 21/6835 438/109 |
| 2011/0057713 A1* | 3/2011 | Kawanami | ........... | H01L 23/642 327/427 |
| 2014/0063767 A1* | 3/2014 | Saitou | ................. | H01L 23/3735 361/783 |
| 2014/0146487 A1* | 5/2014 | Sohn | ...................... | H01L 24/72 361/736 |
| 2014/0167242 A1* | 6/2014 | Kim | ...................... | H01L 23/053 257/690 |
| 2014/0327436 A1* | 11/2014 | Castro Serrato | ....... | G01R 33/07 324/252 |
| 2016/0093589 A1* | 3/2016 | Sato | .................... | H01L 21/4846 257/690 |
| 2017/0330859 A1* | 11/2017 | Soares | .............. | H01L 21/76885 |
| 2017/0338176 A1* | 11/2017 | Tsuyuno | ............... | H01L 23/48 |
| 2018/0040593 A1* | 2/2018 | Zhou | ...................... | H01L 25/071 |
| 2018/0102301 A1* | 4/2018 | Jeon | ................... | H01L 23/49562 |
| 2018/0174945 A1* | 6/2018 | Park | ...................... | H01L 25/072 |
| 2018/0184538 A1* | 6/2018 | Bayerer | ................. | H01L 23/10 |
| 2018/0211938 A1* | 7/2018 | Tsuyuno | ............... | H01L 25/072 |
| 2018/0247885 A1* | 8/2018 | Kinyanjui | ........... | H01L 23/49568 |
| 2019/0043810 A1* | 2/2019 | Kapusta | ............ | H01L 23/3135 |
| 2019/0122970 A1* | 4/2019 | Teysseyre | .......... | H01L 23/4334 |

* cited by examiner

POWER MODULE AND POWER CONVERSION SYSTEM INCLUDING SAME

CROSS REFERENCE TO RELATED APPLICATION

The present application claims the benefit of priority to Korean Patent Application No. 10-2017-0100413, filed on Aug. 8, 2017 in the Korean Intellectual Property Office, the entirety of which is incorporated herein for all purposes by this reference.

TECHNICAL FIELD

The present disclosure relates to a power module and a power conversion system including the same and, more specifically, a power module and a power conversion system including the same, in which dielectric material coating is applied to an area other than a Surface Mount Technology (SMT) area and a dielectric material is inserted in a pore between lead frame patterns to enable lead frames to have an integrated structure, so that the power module can have a 2-in-1, 4-in-1, or 6-in-1 structure in which multiple semiconductors can be mounted on one substrate.

BACKGROUND

A power conversion system (e.g. inverter) is one of the core components of hybrid vehicles and electric vehicles, and a major component for an environmentally friendly vehicle. Many technologies regarding the power conversion system have been developed and a technology for developing a power module is being developed. The power module is a core component of the power conversion system and has the highest cost of production among components of the power conversion system, and is a core technology in the field of environmentally friendly vehicles.

The power module may be an insulated-type power module or a non-insulated-type power module. A conventional non-insulated-type power module uses a single lead frame and thus there may be difficulty in forming a pattern. Therefore, the conventional non-insulated-type power module allows design of a 1-in-1 or 2-in-1 structure but requires a complicated configuration for the lead frame in the case of expansion to a 4-in-1 or 6-in-1 structure, which makes it difficult to expand the structure design of the power module.

Further, an insulated-type two-layered Thermal Interface Material (TIM) and an insulated-type one-layered $Si_3N_4$ ceramic substrate may be applied in order to configure the conventional non-insulated-type power module. Thus, the conventional non-insulated-type power module has a deteriorated heat-radiation property.

Further, the conventional non-insulated-type power module is configured in a multi-layered solder structure due to the application of a spacer thereto and thus has reduced reliability. The conventional non-insulated-type power module requires multiple processes to be applied thereto due to wire bonding and thus needs to ensure the reliability of the wire bonding.

Therefore, there has been a demand for a solution which can develop the power module into an expanded type, can improve a heat-radiation property, and can implement a simplified structure for reliability improvement and process improvement.

The above information disclosed in this Background section is only for enhancement of understanding of the background of the present disclosure and should not be taken as acknowledgement that this information forms the prior art that is already known to a person skilled in the art.

SUMMARY

The present disclosure has been proposed to solve the above-described problems, and an aspect of the present disclosure provides a power module and a power conversion system including the same, in which dielectric material coating is applied to an area other than an SMT area and a dielectric material is inserted in a pore between lead frame patterns to enable lead frames to have an integrated structure, so that the power module can have a 2-in-1, 4-in-1, or 6-in-1 structure in which multiple semiconductors can be mounted on one substrate.

In order to achieve the above-described aspect, a power module according to the present disclosure may include: an upper substrate including a plurality of circuit pattern areas made of a metal and a dielectric area disposed between each of the plurality of circuit pattern areas; a lower substrate including a plurality of circuit pattern areas made of a metal and a dielectric areas disposed between each of the plurality of circuit pattern areas; and a semiconductor element having an upper terminal and a lower terminal, the upper terminal and the lower terminal being bonded to the lower surface of the upper substrate and the upper surface of the lower substrate, respectively.

The power module may further include a dielectric layer disposed between the upper substrate and the lower substrate, wherein the dielectric layer has an opening formed in an area in which the upper substrate and the lower substrate are electrically connected to each other or in an area in which the upper substrate and the semiconductor element are bonded.

The dielectric layer may be coated on the upper surface of the lower substrate.

The dielectric layer may have a conductive lead formed on the upper surface thereof and may include at least on conductive via hole for electrically connecting the conductive lead and the semiconductor element.

The dielectric layer may include 3-40 wt % of an epoxy compound and 50-95 wt % of a ceramic, based on a total weight of the dielectric layer.

The lower surface of the upper substrate may have an embossed portion formed thereon, the embossed portion being formed on at least a part of each of the plurality of circuit pattern areas, and the upper surface of the lower substrate may have an engraved portion formed thereon, the engraved portion being formed on at least a part of each of the plurality of circuit pattern areas.

The semiconductor element may have an upper terminal and a lower terminal which are bonded to the embossed portion and the engraved portion, respectively.

The engraved portion may have a depth formed such that the level of the upper surface of the semiconductor element is substantially identical to the level of the upper surface of the lower substrate on which the engraved portion is not formed.

The power module may further include a dielectric layer formed on the upper surface of the upper substrate or on the lower surface of the lower substrate.

A power conversion system according to the present disclosure may include: the power module; and a cooler configured to be in surface contact with the dielectric layer.

The dielectric layer may include 3-40 wt % of an epoxy compound and 50-95 wt % of a ceramic, based on a total weight of the dielectric layer.

According to the power module and the power conversion system including the same according to various embodiments of the present disclosure, dielectric material coating is applied to an area other than an SMT area and a dielectric material is inserted in a pore between lead frame patterns to enable lead frames to have an integrated structure, so that the power module can have a 2-in-1, 4-in-1, or 6-in-1 structure in which multiple semiconductors can be mounted on one substrate.

Further, in the power module and the power conversion system including the same according to various embodiments of the present disclosure, it is possible to form a part, on which a semiconductor element is to be mounted, on the same planar surface as that of a lead frame in an engraving manner and to form an embossed pattern on the upper substrate, thereby removing a spacer and simplifying the structure of a vertical connection between lead frames.

Further, in the power module and the power conversion system according to various embodiments of the present disclosure, a dielectric material excluding a ceramic can be applied to bonding of the power module to prevent use of conventional thermal grease, which may deteriorate the thermal properties of the device. Therefore, the present disclosure provides a power module and power conversion system with improved bonding heat-radiation properties, allowing for an improved insulation property, so as to configure the power module having an improved cooling property.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Hereinafter, a description will be made of a power module and a power conversion system including the same according to various embodiments of the present disclosure.

Figure 1:
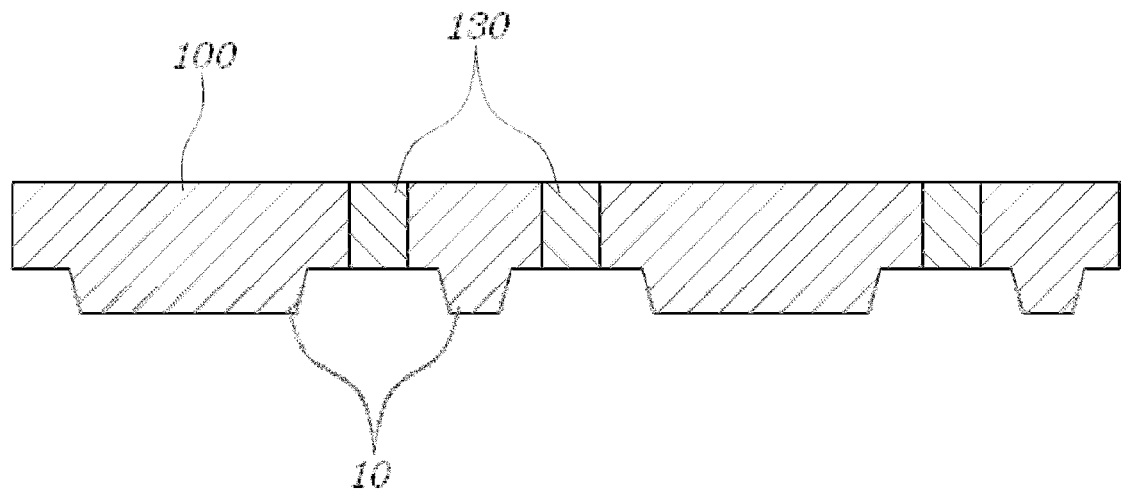
FIG. 1 illustrates the structure of an upper substrate of a power module according to an embodiment of the present disclosure.
Figure 2:
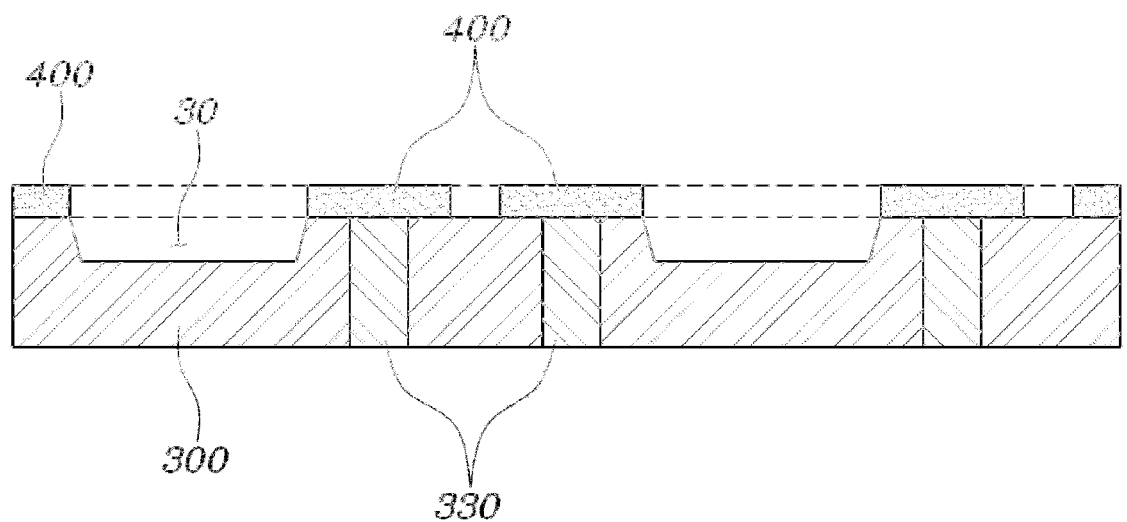
FIG. 2 illustrates the structure of a lower substrate of the power module according to an embodiment of the present disclosure.
Figure 3:
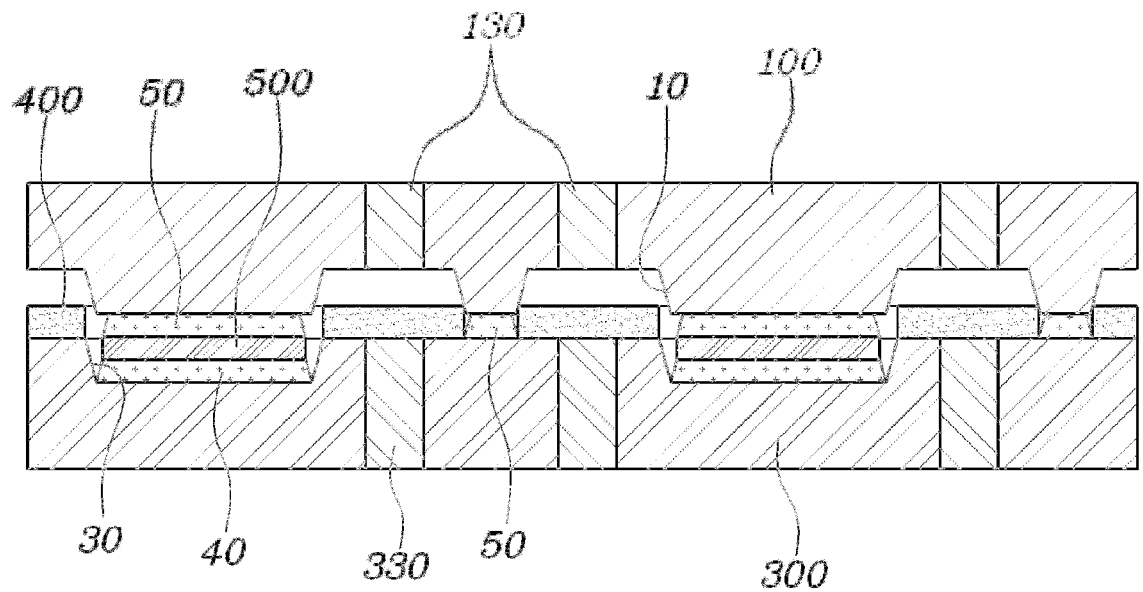
FIG. 3 illustrates the structure of the power module according to an embodiment of the present disclosure.
Figure 4:
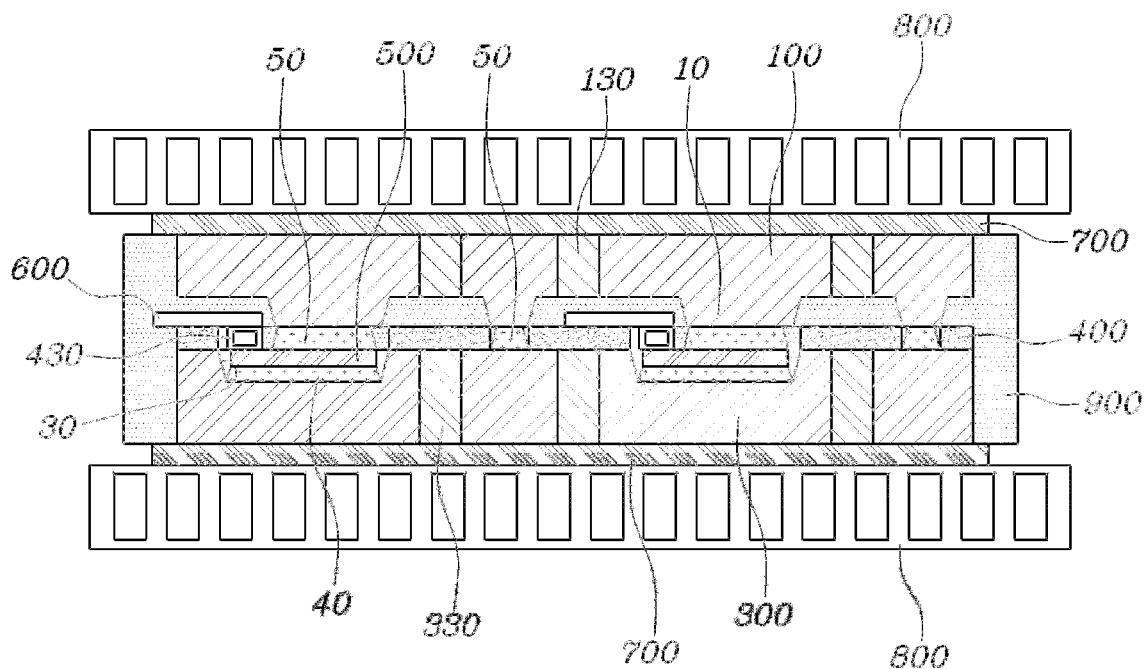
FIG. 4 illustrates the structure of a power conversion system including the power module according to an embodiment of the present disclosure.

FIG. 1 illustrates the structure of an upper substrate of a power module according to an embodiment of the present disclosure. FIG. 2 illustrates the structure of a lower substrate of the power module according to an embodiment of the present disclosure. FIG. 3 illustrates the structure of the power module according to an embodiment of the present disclosure. FIG. 4 illustrates the structure of a power conversion system including the power module according to an embodiment of the present disclosure.

First, referring to FIGS. 1 to 3, the power module according to an embodiment of the present disclosure may include: an upper substrate 100 including a plurality of circuit pattern areas made of a metal and a dielectric area disposed between each of the plurality of circuit pattern areas; a lower substrate 300 including a plurality of circuit pattern areas made of a metal and a dielectric area disposed between each of the plurality of circuit pattern areas; and a semiconductor element 500 having an upper terminal and a lower terminal, which are bonded to the lower surface of the upper substrate 100 and the upper surface of the lower substrate 300, respectively.

The upper substrate 100 includes a plurality of circuit pattern areas made of a metal and a dielectric area 130 disposed between each of the plurality of circuit pattern areas, wherein an embossed portion 10 may be formed on at least a part of each of the plurality of circuit pattern areas.

Here, the metal may be Cu. Referring to FIG. 1, the plurality of circuit pattern areas are metallic areas having a predetermined pattern structure. A process of forming a pattern is widely known and a description thereof will be thus omitted. A space between the circuit pattern areas made of the metal corresponds to a pore. A dielectric material, which is a dielectric, is inserted in the pore to constitute the dielectric area 130. The dielectric of the dielectric area 130 is an organic-inorganic composite dielectric material and includes 3-40 wt % of an epoxy-based resin and 50-95 wt % of a ceramic, based on a total weight of the dielectric layer. Here, boron nitride or the like may be used as the ceramic. A dielectric material having the above-described composition may be pressed and bonded at a low temperature of about 180° C., and may have low thermal stress after being bonded and may have excellent elasticity and toughness to prevent the same from being broken due to a difference in thermal expansivity. The dielectric area 130, i.e., the dielectric area 130 formed by a dielectric material inserted between lead frames, can enlarge a heat-radiation area, and the dielectric material may have thermal conductivity of 20-50 W/mK and may thus enable heat to be transferred in the horizontal direction.

The embossed portion 10 of the upper substrate 100 may be formed in an etching manner.

The embossed portion 10 is formed on one surface of a metallic circuit pattern area (the lower surface of the upper substrate 100) so as to be directly soldered 50 to the semiconductor element 500 and the lower substrate 300 which will be described hereafter. Through this structure, a conventional spacer having low reliability can be removed.

Referring to FIG. 2, the lower substrate 300 includes a plurality of circuit pattern areas made of a metal and a dielectric area 330 disposed between each of the plurality of circuit pattern areas, wherein an engraved portion 30 may be formed on at least a part of each of the plurality of circuit pattern areas.

Here, the metal may be Cu identical to the metal of the upper substrate 100. Further, the plurality of circuit pattern areas may be identical to the plurality of circuit pattern areas of the upper substrate 100 and may be metallic areas having a predetermined pattern structure. Like the dielectric area 130 of the upper substrate 100, the dielectric area 330 may also be an area formed by a dielectric material inserted in a pore between the circuit pattern areas made of the metal. Further, the dielectric of the dielectric area 330 may be the same as that of the dielectric area 130 of the upper substrate 100 and may be an organic-inorganic composite dielectric material. As described above, the dielectric area 130, i.e., a dielectric material inserted between lead frames, can enlarge the heat-radiation area, and the dielectric material may have thermal conductivity of 20-50 W/mK and thus may enable heat to be transferred in the horizontal direction. Further, by forming the dielectric material insertion integrated lead frame structure, a 2-in-1, 4-in-1, or 6-in-1 structure, which allows multiple semiconductor elements 500 described hereafter to be mounted on one substrate all together, can be used.

Hereinafter, dielectrics of dielectric layers 400 and 700 (illustrated in FIGS. 2 to 4), described later, may be an organic-inorganic composite dielectric material identical to those of the upper substrate 100 and the lower substrate 300.

A process of forming the lower substrate 300 will be briefly described before the structure of the lower substrate 300 in FIG. 2 is described. First, a dielectric, i.e., a dielectric material, is coated on the upper surface of the lower substrate 300 to form a dielectric layer 400. The dielectric, i.e., the dielectric material is inserted in a pore between the circuit pattern areas so that lead frames are integrated. Further, an engraved portion 30 of the lower substrate 300 is formed in an etching manner, and, when only a part on which the engraved portion 30 is formed is removed from the dielectric layer 400 formed on the upper surface of the lower substrate 300, the structure of the lower substrate 300 is formed as illustrated in FIG. 2 (the drawing does not include a top plan view but, in relation to a dotted line part in FIG. 2, the dielectric layer 400 of the engraved portion 30, on which the semiconductor element 500 is to be mounted, is removed and the remaining part, on which the semiconductor element 500 is not to be mounted, has the dielectric layer 400 formed thereon). Next, referring to FIG. 3, a lower terminal of the semiconductor element 500 is bonded to the engraved portion 30 of the lower substrate 300 by soldering (40). In this case, the depth of the engraved portion 30 of the lower substrate 300 may be formed such that the level of the upper surface of the semiconductor element bonded to the engraved portion 30 is substantially identical to the level of the upper surface of lower substrate 300 on which the engraved portion is not formed. In other words, the semiconductor element 500 may be disposed such that the upper surface of the semiconductor element 500 is positioned at ±50 um level with reference to the upper surface of the lower substrate 300 on which the engraved portion 30 is not formed and thus forms substantially the same plane. Through this structure, the upper substrate 100, the lower substrate 300, and the semiconductor element 500 can be directly soldered together. Therefore, a spacer included in the conventional power module can be removed so as to minimize a solder layer which has low reliability.

Referring to FIG. 3, the power module further includes a dielectric layer 400 disposed between the upper substrate 100 and the lower substrate 300, wherein the dielectric layer 400 may have an opening in an area 50 in which the upper substrate 100 and the lower substrate 300 are electrically connected to each other or in an area 50 in which the upper substrate and the semiconductor element are bonded.

Here, the opening is a hole formed through a part of the dielectric layer 400 on the upper surface of the lower substrate 300, described as above, wherein the engraved portion 30 is formed on the part of the dielectric layer 400. Solder is inserted in the opening so as to directly solder the upper substrate 100 and the lower substrate 300 onto the semiconductor element 500. Through this soldering, the upper substrate 100 and the lower substrate 300 are electrically connected, an upper terminal of the semiconductor element 500 is bonded to the embossed portion 10 of the upper substrate 100, and a lower terminal thereof is bonded to the engraved portion 30 of the lower substrate 300. The direct soldering of the embossed portion 10 of the upper substrate 100 and the engraved portion 30 of the lower substrate 300 onto the semiconductor element 500 can simplify the structure of a vertical connection between lead frames.

Referring to FIG. 4, the power module may further include a dielectric layer 700 formed on the upper surface of the upper substrate 100 or on the lower surface of the lower substrate 300.

Here, the dielectric may be the same as the above-described dielectric of the dielectric area 130 of the upper substrate 100 and may be an organic-inorganic composite dielectric material.

The dielectric layer 700 is a part in contact with a cooling means 800 and has a structure for replacing a conventional structure of Thermal Interface Material (TIM)+$Si_3N_4$+Thermal Interface Material (TIM). This structure can prevent use of thermal grease, which is mainly used as a TIM having a deteriorated thermal property, and thus can improve the bonding property and heat-radiation property of the substrate. Further, this structure can ensure even an insulation property, so as to configure a power module to have an improved cooling property.

Referring to FIG. 4, a conductive lead 600 is formed on the upper surface of the dielectric layer 400 on the upper surface of the lower substrate 300, and the dielectric layer 400 may include at least on conductive via hole 430 for electrically connecting the conductive lead 600 and the semiconductor element 500.

Here, the conductive lead 600 is electrically connected to the semiconductor element 500 by a solder which is inserted in the via hole 430 formed through the dielectric layer 400. Further, as an embodiment of the present disclosure, the conductive lead 600 may form a signal portion and metallic circuit pattern areas of the upper substrate 100 and of the lower substrate 300 may form power portions.

Referring to FIG. 4, a power conversion system according to an embodiment of the present disclosure may include: a power module; and a cooling means 800 configured to be in surface contact with the dielectric layer 700.

Here, the power module may include an upper substrate 100, a lower substrate 300, and a semiconductor element 500, which have the structures according to the present disclosure, respectively, and may be a power module to which an epoxy molding compound (EMC) is applied as a filler 900. The cooler 800 may be a powered cooling device or a cooling channel.

As described above, in the power module and the power conversion system including the same according to various embodiments of the present disclosure, dielectric material coating is applied to an area other than an SMT area and a dielectric material is inserted in a pore between lead frame patterns to enable lead frames to have an integrated structure, so that the power module can have a 2-in-1, 4-in-1, or 6-in-1 structure in which multiple semiconductors can be mounted on one substrate.

Further, in the power module and the power conversion system including the same according to various embodiments of the present disclosure, it is possible to form a part, on which a semiconductor element is to be mounted, on the same planar surface as that of a lead frame in an engraving manner and to form an embossed pattern on the upper substrate, thereby removing a spacer and simplifying the structure of a vertical connection between lead frames.

Further, in the power module and the power conversion system according to various embodiments of the present disclosure, a dielectric material excluding a ceramic can be applied to bonding of the power module to prevent use of conventional thermal grease, which has a deteriorated thermal property. Therefore, the power module and the power conversion system can improve a bonding property and a heat-radiation property and ensure even an insulation property, so as to configure the power module having a more excellent cooling property.

The present disclosure has been illustrated and described with reference to particular embodiments thereof. However, it would be obvious to a person skilled in the art that various modifications and changes are possible within the technical idea of the present disclosure, provided by the accompanying claims.

What is claimed is:

1. A power module comprising:
    an upper substrate comprising a plurality of circuit pattern areas made of a metal and a dielectric area disposed in at least one of areas between the plurality of circuit pattern areas;
    a lower substrate including a plurality of circuit pattern areas made of a metal and a dielectric area disposed in at least one of areas between the plurality of circuit pattern areas;
    a semiconductor element having an upper terminal and a lower terminal, the upper terminal and the lower terminal being attached to a lower surface of the upper substrate and an upper surface of the lower substrate, respectively;
    a dielectric coating layer disposed between the upper substrate and the lower substrate; and
    a filler disposed between the upper substrate and the lower substrate,
    wherein the dielectric coating layer has an opening defined in an area in which the upper substrate and the lower substrate are electrically connected to each other or in an area in which the upper substrate and the semiconductor element are attached to each other,
    the dielectric coating layer comprises 3-40 wt % of an epoxy compound and 50-95 wt % of a ceramic, based on a total weight of the dielectric coating layer,
    the lower surface of the upper substrate has an embossed portion disposed on at least a part of each of the plurality of circuit pattern areas, and
    the upper surface of the lower substrate has an engraved portion disposed on at least a part of each of the plurality of circuit pattern areas.

2. The power module of claim 1, wherein the dielectric coating layer is coated on the upper surface of the lower substrate.

3. The power module of claim 2, wherein the dielectric coating layer has a conductive lead disposed on the upper surface thereof and comprises at least one conductive via hole for electrically connecting the conductive lead and the semiconductor element.

4. The power module of claim 1, wherein the semiconductor element has an upper terminal and a lower terminal which are attached to the embossed portion and the engraved portion, respectively.

5. The power module of claim 4, wherein a level of an upper surface of the semiconductor element is substantially identical to a level of the upper surface of the lower substrate on which the engraved portion is not disposed.

6. The power module of claim 1, wherein the dielectric coating layer is disposed on an upper surface of the upper substrate or on a lower surface of the lower substrate.

7. A power conversion system comprising:
    the power module set forth in claim 6; and
    a cooler configured to be in surface contact with the dielectric coating layer.

8. The power conversion system of claim 7, wherein the dielectric coating layer is a solid layer.

9. The power module of claim 1, wherein the filler is disposed between the dielectric coating layer and at least one of the upper substrate and the lower substrate.

10. The power module of claim 1, wherein the filler is disposed between the dielectric coating layer and the upper substrate, and between the dielectric coating layer and the lower substrate.

* * * * *